United States Patent [19]

Hollander

[11] 4,214,200
[45] Jul. 22, 1980

[54] LIGHT-EMISSIVE ELECTRICAL MEASUREMENT APPARATUS WITH FLOATING INPUTS

[76] Inventor: James F. Hollander, 3000 Douglas Ave., No. 13, Des Moines, Iowa 50310

[21] Appl. No.: 956,669

[22] Filed: Nov. 1, 1978

[51] Int. Cl.² .................. G01R 19/00; G01R 19/16
[52] U.S. Cl. ................................. 324/122; 324/96; 324/123 R; 324/133
[58] Field of Search .............. 324/103 P, 98, 133, 324/96, 122, 123 R

[56] References Cited

U.S. PATENT DOCUMENTS

| | | | |
|---|---|---|---|
| 3,872,386 | 5/1975 | Luhowy | 324/98 |
| 4,017,796 | 4/1977 | Tobias | 324/96 |

OTHER PUBLICATIONS

Simpson Electric Co., Cat. 4700, 1977, p. 3, Simpson Electric Co., Elgin, Ill.
Instruments & Control Systems, Apr. 1976, p. 62.
Instruments & Control Systems, May 1976, p. 105.
Instruments & Measurements for Electronics, by C. N. Herrick, 1972, pp. 136–145, McGraw-Hill, New York, N.Y.

*Primary Examiner*—Ernest F. Karlsen

[57] ABSTRACT

An electrical meter has light-emissive display elements and a meter circuit featuring electrically floating input terminals relative to device ground, and offers a potentially significant cost advantage compared to available alternatives in low-accuracy measuring applications.

A series string of the light-emissive display elements are physically arranged along a line in order of increasing turn-on current threshold of each element so that they are successively turned on along the line with increasing current to be measured. A control circuit included in the series string has first and second semiconductively-complementary active semiconductor devices, such as an NPN and PNP transistor, each with base, emitter, and collector. The input-sensing conductor, such as a base, of each active semiconductor is a respective floating input of the meter. The semiconductors have at least two output control conductors, such as collector and emitter, two corresponding control conductors being wired together (as emitter to emitter) and the other two being wired into the series string. The light-emitting elements are suitably semiconductor diodes (LEDs), incandescent bulbs, neon bulbs, or other devices, with resistive shunting where necessary.

Two such meter circuits are wired back-to-back with their light-emissive elements arranged physically back-to-back to form an uncomplicated galvanometer device for measuring electrical currents of either positive or negative polarity.

5 Claims, 3 Drawing Figures

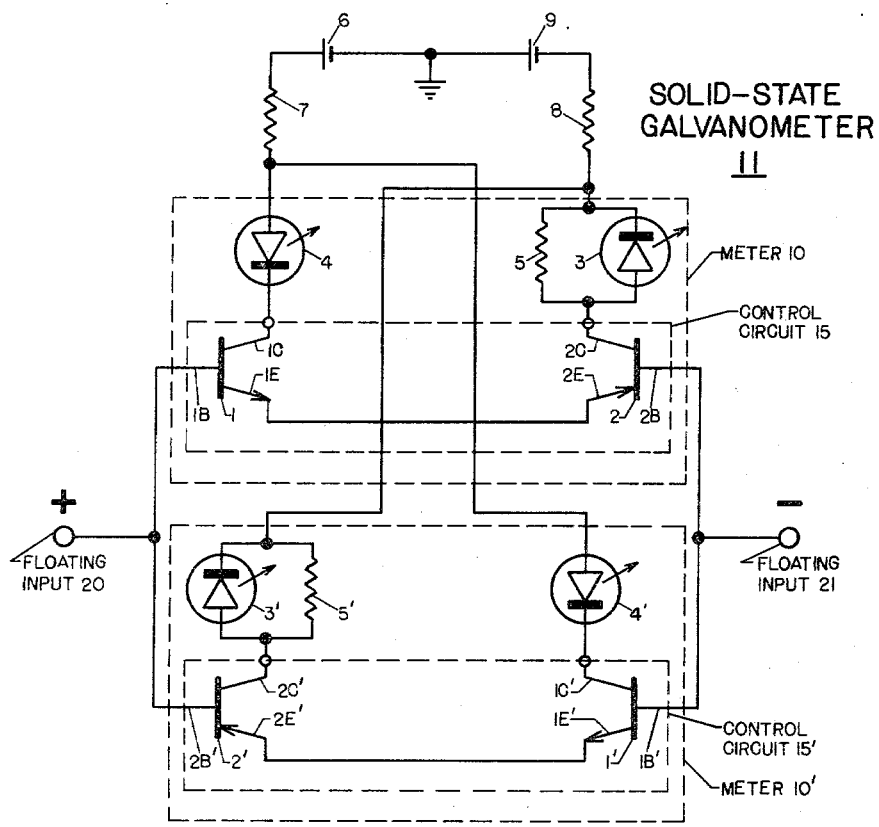

LIGHT-EMISSIVE ELECTRICAL MEASUREMENT APPARATUS WITH FLOATING INPUTS

BACKGROUND OF THE INVENTION

The present invention relates to the electronics field of solid-state electrical measurement apparatus. More particularly, the present invention relates to solid-state electrical meters having light-emissive displays and floating electrical inputs.

Electrical meters of the electromechanical type (such as the D'Arsonval type) are well known, but such meters frequently exhibit disadvantageous large size, incompatibility with direct printed circuit mounting and soldering, lack of self-emitting displays, and substantial per-unit cost. Galvanometers of the electromechanical type frequently exhibit the same disadvantages, but the designer's desire for their additional advantage of reading both electrical polarities on the same scale is often offset by considerations of even higher per-unit cost and occasional out-of-stock unavailability problems. Also, even the least expensive electromechanical meters may feature a much higher accuracy than the designer needs for a given low-accuracy application.

Recently, light-emitting meters using light-emitting diodes or neon light emitters for displays have been offered in an apparent attempt to compete with other meters in a relatively high-accuracy end of the meter market. However, none of these apparently are price-competitive with the least expensive lower-accuracy electromechanical meters at the low end of the market. Moreover, light-emitting meters are likely to be powered by a power supply having a ground. This presents a problem of how a radically simplified light-emitting meter might be constructed with floating input terminals, that is, terminals neither of which are significantly constrained in their voltage relationship to that ground.

SUMMARY OF THE INVENTION

In the present invention, the problem of floating terminal requirements is solved and the construction of a light-emissive meter adapted for low-accuracy applications is considerably simplified.

In a subcombination aspect of the invention, a light-emitting meter article is provided, the meter having a series configuration of light-emitting assemblies and a control circuit. The light-emitting assemblies have different current thresholds at which their light begins to turn on, and they are physically arranged in such order that they successively turn on along a line with increasing current in the series configuration. The control circuit includes first and second semiconductively-complementary active semiconductor devices, each having an input-sensing conductor and also having first and second output control conductors. The input-sensing conductors of the complementary devices are the floating inputs of the meter. The two first output-control conductors of the complementary devices are electrically connected together, and the two second output-control conductors of the complementary devices are electrically connected into the series configuration.

In a galvanometer combination aspect of the invention, two light-emitting meter subcombinations as above are provided and wired back-to-back so that the input-sensing conductor of each subcombination control circuit is electrically connected to the input-sensing conductor of the semiconductively-complementary active semiconductor device in the control circuit of the other subcombination. Analogously, the light-emissive elements of each subcombination are physically placed along the line symmetrically opposite one another to obtain a galvanometer display effect, or otherwise located in whatever display placement may be desired.

It is found that a useful display effect is obtained with as few as two light-emissive elements per meter subcombination. The semiconductor devices may merely be NPN and PNP general-purpose transistors of inexpensive widely available type. Nothing more being needed to produce the meter article, the simplicity and amenability to low cost production are evident. All of the components are readily mounted on a printed circuit board, if desired, in a further advantageous feature of the invention. In a preferred embodiment illustrated and described below, the invention is sensitive to currents to be measured on the order of tens of microamperes.

It is apparent that the meter subcombination, and galvanometer combination, have utility in any metering, test, control, communications or other application to which their simplicity and circuit compatibility suit them. The invention is advantageously employed with series resistors, and meter shunt resistors, for voltmeter and ammeter applications and otherwise employed in meter circuits in the manner of presently available meters.

DETAILED DESCRIPTION OF THE DRAWING

Figure 1:
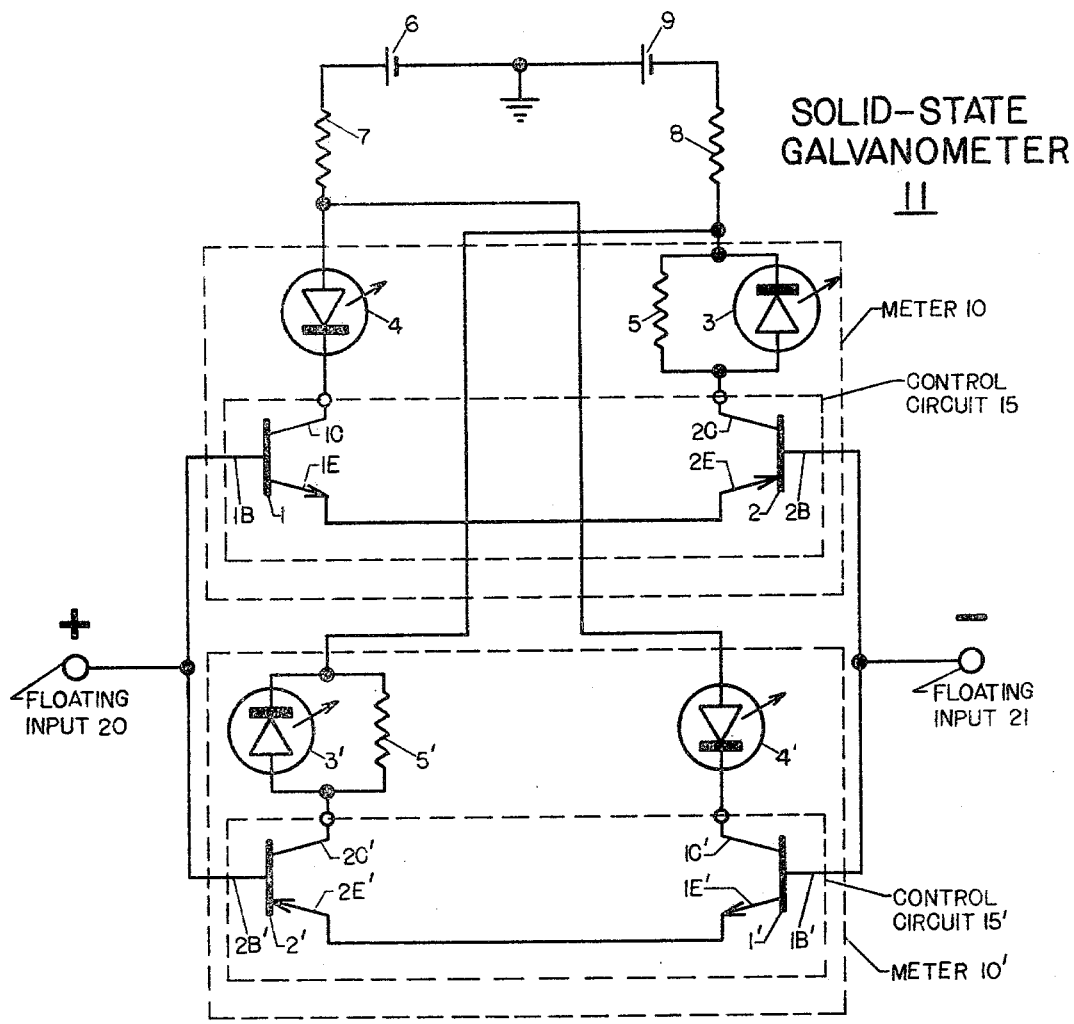
FIG. 1 is an electrical schematic diagram of the circuit of a galvanometer according to the invention including two meter subcombinations each according to the invention.

In FIG. 1 solid-state galvanometer 11 has two solid-state meter subcombinations 10 and 10' connected as shown so as to have floating inputs 20 (plus "+" terminal) and 21 (minus "−" terminal). Galvanometer 11 is powered by positive voltage source 6 having current limiting resistor 7 and by negative voltage source 9 having current limiting resistor 8.

The solid-state meter subcombinations 10 and 10' are of suitably identical construction as shown in FIG. 1, so all components of meter 10' are shown with figure numbers primed when compared to the corresponding components of meter 10. In the interest of brevity, all circuit description of meter 10' corresponding to that of meter 10 is omitted.

Figure 3:
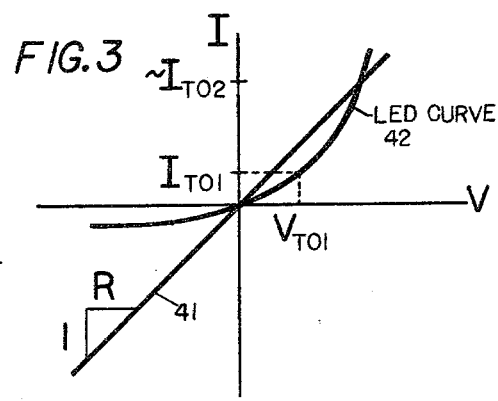
FIG. 3 is a current-versus-voltage (I-V) diagram of an assembly of a light-emitting diode (LED) and shunt resistor usable for obtaining selectable current turn-on thresholds for use in meters and galvanometers of the invention.

Meter 10 has a first light-emitting semiconductor diode (LED) assembly 4 having an anode terminal for entry of current connected to resistor 7 and a cathode terminal for exit of current. As shown in FIG. 3 this LED has an I-V characteristic curve 42 and a turn-on current threshold $I_{TO1}$ at some turn-on voltage threshold $V_{TO1}$ for the device. When less than the threshold current passes through the diode, no light emission is observed. At the threshold current, the first light is seen, and with increasing diode current, the light output increases.

Meter 10 has a second light-emitting semiconductor diode assembly 3,5 including LED 3 and shunt resistor 5. For consistency assembly 3,5 is considered to have cathode and anode terminals corresponding to those of LED 3 for entry and exit of the assembly current. Assembly 3,5 has its cathode terminal connected to resistor 8 and anode terminal connected to collector 2C. Because assembly 3,5 includes a shunt resistor which diverts current from LED 3 (typically having the same LED curve 42 of FIG. 3) the linear I-V curve 41 of resistor 5 sums with LED curve 42 so that the turn-on threshold $I_{TO2}$ of assembly 3,5 is increased to be considerably greater than $I_{TO1}$ at the same turn-on voltage $V_{TO1}$.

Figure 2:
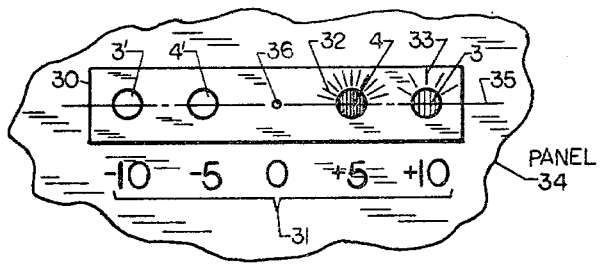
FIG. 2 is a plan view of a cutaway of a meter panel showing the physical arrangement of the light-emitting devices of the galvanometer and meter subcombinations of the invention.

Referring to FIG. 2, LED 4 of assembly 4 and LED 3 of assembly 3,5 are arranged along line 35 so that the LEDs 4 and 3 are turned on successively along line 35 with an increase of current through them so as to produce a meter-like display indication. For example, at zero current, both LED 4 and 3 are off. At 2.5 arbitrary units of current, LED 4 is at half brightness, and LED 3 is off. At 5 units, LED 4 is at full brightness and LED 3 is off. At 7.5 units, LED 4 is at full brightness (shown by rays 32) and LED 3 is at half brightness (shown by rays 33). At 10 units, LED 4 and LED 3 are both at full brightness. Although only two LEDs are used in the illustrated meter subcombinations, the meter-like display effect is remarkably apparent when actually observed.

The same electric current from the power supply 6,7,8,9 passes into and through assemblies 4 and 3,5 of FIG. 1. The amount of the electrical current is controlled by control circuit 15. Control circuit 15 has NPN transistor 1 and PNP transistor 2. NPN transistor 1 has collector 1C, emitter 1E, and base 1B. PNP transistor 2 has collector 2C, emitter 2E, and base 2B. An electrical current to be measured passes into floating input 20 which is a conductive path to base 1B, thence to emitter 1E and along a conductive path to emitter 2E and to base 2B, and thence out the base 2B conductor which is floating input 21. Since transistors 1 and 2 are semiconductively-complementary by virtue of one being NPN and the other PNP, a forward-biased "easy" current path is available through control circuit 15 for current passing into floating input 20 and out of floating input 21.

Transistors 1 and 2 act as approximately linear DC amplifiers of the current to be measured from the floating inputs 20 and 21, and the collectors 1C and 2C of the transistors act as output terminals for the control circuit. Together with the cathode and anode terminals of the LED assemblies 4 and 3,5 the control circuit output terminals are wired in a series string configuration including the light-emitting assemblies 4 and 3,5 and the control circuit 15.

Thus, the current passing around the series configuration into anode of LED 4, into collector 1C, out collector 2C, into assembly 3,5 and out of assembly 3,5 is made approximately proportional to the current to be measured at the floating inputs by virtue of the transistor amplifying effect (beta). Since shunt resistor 5 makes the turn-on threshold for light-emission for assembly 3,5 greater than for assembly 4, a meterlike display effect is obtained when LEDs 4 and 3 are arranged along line 35 as shown in FIG. 2.

In an experimental model of the invention, sources 6 and 9 were plus and minus fifteen (±15) volt outputs of a transistor power supply, resistors 7 and 8 were 1100 ohms (1.1 K), light-emitting diodes 3, 3',4, and 4' were low-current twenty milliampere (20 ma. for full brightness) red LEDs, shunt resistors 5 and 5' were one hundred eighty (180) ohms, and transistors 1 and 1' (NPN) and transistors 2 and 2' (PNP) were low-power medium-beta general purpose transistors. The galvanometer circuit was wired on experimenter's vectorboard with the LEDs arranged as shown in FIG. 2 and in a manner demonstrating the compatibility of the invention with low-cost printed circuit construction. A cardboard panel with a rectangular aperture having scale markings as illustrated in FIG. 2 was laid over the circuit board leaving the LEDs showing in a demonstration of the galvanometer. The floating inputs were connected to a circuit (not shown) for providing variable voltage between plus and minus nine (±9) volts to a one hundred thousand ohm (100 K) resistor in series with the galvanometer inputs. This source of ninety microampere maximum current (90 ua.) could produce full-scale indications on the display LEDs of the galvanometer with either polarity, as expected.

Terminals 20 and 21 are considered to be floating because they share certain important advantageous features with the terminals of electromechanical meters of familiar type. First, notwithstanding the common connection of voltage sources 6 and 9 to ground, the connection of either floating input 20 or 21 to ground (after having been disconnected, for instance) while the other input 21 or 20 is disconnected from ground does not cause any discernible effect or indication of current flow through the LEDs 4 or 3. Second, connection of input 21 to ground and passing a given current into input 20 results in substantially the same current display indication of the LEDs 4 and 3 as connecting input 20 to ground and passing the same given current from input 21.

Because a transistor is capable of being connected in the common-collector and common-base configurations as well as the common-emitter configuration, the designation of base as an input-sensing conductor, and emitter and collector as respective first and second output-control conductors are merely features of the preferred embodiment illustrated in FIG. 1, and are not requirements of the invention in its broadest scope. Moreover, semiconductor devices other than ordinary transistors are usable in the invention, for example, field-effect transistors and Darlington combinations.

The meter subcombinations 10 and 10' in FIG. 1 are wired back-to-back to form a galvanometer, or dual-polarity-reading meter, by electrically connecting the input-sensing conductor of each semiconductor means of the control circuit of each meter subcombination to the input-sensing conductor of the semiconductor means semiconductively-complementary thereto in the control circuit of the other meter subcombination. In the embodiment of FIG. 1 this means that the PNP transistor bases 2B and 2B' in each meter subcombination 10 or 10' are respectively connected to the NPN transistor bases 1B' and 1B in the other meter subcombination 10' or 10. Thus, positive current passing into terminal 20 goes through meter subcombination 10 and out terminal 21, while a positive current passing into terminal 21 goes through meter subcombination 10' and out terminal 20.

To obtain a dual-polarity indication or galvanometric meter display effect, the LEDs 4' and 3' of meter subcombination 10' are arranged in symmetrically opposite order, or back-to-back, relative to LEDs 4 and 3 of meter subcombination 10 along the line 35 in FIG. 2. In other words, corresponding LEDs are mirror-imaged on the same line 35 around center-of-symmetry point 36. Also, the lower turn-on threshold LEDs are adjacent and the higher turn-on LEDs are symmetrically located in the more physically extreme positions. It is to be noted, however, that line 35 is not necessarily a straight line, but can also be suitably curved in the manner of meter scales of available meters. A meter panel 34 having scale markings 31 is provided with aperture 30 to permit observation of the LEDs 3',4',4, and 3 with reference to scale markings 31.

An interesting feature of the galvanometer 11 disclosed herein is its use of both physical and electrical symmetry. In particular, because the bases of the NPN and PNP transistors are electrically connected as they are, there is an electrical symmetry of the floating input terminals 20 and 21 with respect to ground.

It should further be noted that shunt resistors 5 and 5' are suitably dispensed with if the LEDs 3 and 3' are selected to inherently have a higher turn-on current threshold for light emission than LEDs 4 and 4' respectively. Also, additional LED assemblies having further different turn-on current thresholds are suitably wired into the series configuration presently consisting only of LED assembly 4, control circuit 15, and LED assembly 3,5 in meter 10 of FIG. 1. Then the additional LEDs in the assemblies are physically arranged along line 35 of FIG. 2 in the order of turn-on thresholds of their LED assemblies. In this way an even more effective meter-like display is obtainable. Of course, the higher the turn-on threshold desired, the lower in value should be the shunt resistor, if each LED is the same.

Light-emitting diodes (LEDs) are found to be suitable for use in the light-emitting assemblies. Incandescent bulb assemblies, neon bulb assemblies or other means for emitting light having turn-on thresholds are also suitable alternative components for use in practicing the invention.

In all cases the invention contemplates a variety of embodiments in addition to the preferred embodiment illustrated herein so that the skilled worker in the art may adapt the invention for a variety of purposes, and so that the utility of the invention may be fully realized.

I claim:

1. Electrical measurement apparatus comprising
    a plurality of means for emitting light in response to a first electrical current, each said light-emitting means having a different turn-on threshold to said first current, each said light-emitting means having two terminals for entry and exit respectively of said first current;
    meter scale means for displaying a plurality of magnitudes of a same sign to be measured, said light-emitting means being physically arranged relative to said meter scale means in order of increasing current threshold so as to correspond to said magnitudes of said meter scale means;
    means for providing an electrical current to be measured;
    means for supplying said first electrical current for said light-emitting means; and
    means for controlling said first current in response to said measurement current comprising first and second semiconductively-complementary active semiconductor means each having first and second output-control conductors and an input-sensing conductor, said first output-control conductor of said first semiconductor means being electrically connected to said first output-control conductor of said second semiconductor means, said second output-control conductors of said first and second semiconductor means being two output terminals for said control means, said input-sensing conductor of said first semiconductor means and said input-sensing conductor of said second semiconductor means being connected to said measurement current means so that said measurement current passes into one of said input-sensing conductors, thence to the first output-control conductor of the semiconductor means having said one said input-sensing conductor and to the first output-control conductor of the other semiconductor means and thence from the other said input-sensing conductor of said other semiconductor means to said measurement current providing means;
    said light-emitting means terminals, said first current supply means and said first current control means output terminals being electrically connected in a single series configuration including said light-emitting means and said control means;
    said plurality of light-emitting means being successively turned on with increasing measurement current magnitude, all said plurality of light-emitting means emitting light when said measurement current is present in an amount corresponding to the largest magnitude to be measured on said meter scale means.

2. Electrical measurement apparatus as claimed in claim 1 wherein
    each said means for emitting light comprises a light-emitting diode having a diode turn-on threshold and at least one said means for emitting light also comprises a shunt resistor for increasing the turn-on threshold of said at least one said means compared to the diode turn-on threshold of the light-emitting diode in shunt therewith.

3. Electrical measurement apparatus as claimed in claim 1 wherein
    said first and second semiconductively-complementary active semiconductor means are an NPN transistor and a PNP transistor respectively, said transistors each having a collector, an emitter, and a base,
    said input-sensing conductors of said first and second semiconductor means being said NPN transistor base and said PNP transistor base respectively,
    said first output-control conductors being said NPN transistor emitter and said PNP transistor emitter respectively,
    said second output-control conductors being said NPN transistor collector and said PNP transistor collector respectively.

4. Electrical measurement apparatus comprising
    a positive voltage source having a first resistance and a negative voltage source having a second resistance, said positive and negative voltage sources being connected to a ground;
    first and second light-emitting semiconductor diodes each having a cathode and an anode;
    a PNP and an NPN transistor, said transistors respectively having a collector, a base, and an emitter;

resistor means;

said first diode cathode being connected to said source of negative voltage, said second diode anode being connected to said source of positive voltage, one and only one of said first and second diodes having any said resistor means connected in parallel with itself;

said first diode anode being connected to said PNP transistor collector, said second diode cathode being connected to said NPN transistor collector, said transistors having their emitters connected together;

meter scale means for displaying a plurality of magnitudes of a same sign to be measured, said light-emitting diodes being arranged along said meter scale means so that said diode having said parallel resistor is located along said scale to correspond to a higher magnitude than said other diode; and means for providing an electrical current to be measured;

said base of said PNP transistor and said base of said NPN transistor being connected to said means for providing said current to be measured so as to permit said current to be measured to enter the base of said NPN transistor and flow from said NPN transistor emitter to said PNP transistor emitter and thence flow from said base of said PNP transistor back to said means for providing said current to be measured thereby to cause said light-emitting diodes to emit light with substantially the same display indication regardless of whether said base of said PNP transistor be grounded or whether said base of said NPN transistor be grounded when the same current to be measured is provided.

5. Electrical measurement apparatus comprising a first and a second plurality of means for emitting light in response to a first electrical current, each said light-emitting means in said first plurality having a different turn-on threshold to said first current from each other said light-emitting means in said first plurality, each said light-emitting means in said second plurality having a different turn-on threshold to said first current from each other said light-emitting means in said second plurality, each said light-emitting means in each said plurality having two terminals for entry and exit respectively of said first current;

meter scale means for displaying a plurality of magnitudes of a positive sign to be measured and a plurality of magnitudes of a negative sign to be measured, said first plurality of light-emitting means being physically arranged relative to said meter scale means in order of increasing current threshold so as to correspond to said magnitudes of said positive sign of said meter scale means and said second plurality of light-emitting means being physically arranged relative to said meter scale means in order of increasing current threshold so as to correspond to said magnitudes of said negative sign of said meter scale means;

means for providing an electrical current to be measured;

means for supplying said first electrical current for said light-emitting means; and first and second means for controlling said first current in said first and second pluralities respectively of light-emitting means in response to said measurement current, said first and said second controlling means each comprising first and second semiconductively complementary active semiconductor means, each semiconductor means having first and second output-control conductors and an input-sensing conductor, said first output-control conductor of said first semiconductor means in each said controlling means being electrically connected to said first output-control conductor of said second semiconductor means therein, said second output-control conductors of said first and second semiconductor means being two output terminals for said each said controlling means, said input-sensing conductor of each said semiconductor means of said first controlling means being electrically connected to the input-sensing conductor of the semiconductor means semiconductively complementary thereto in said second controlling means, and said input-sensing conductor of said first semiconductor means of said first controlling means and said input-sensing conductor of said second semiconductor means of said first controlling means being connected across said measurement current means so that said measurement current passes through one and only of said first and second controlling means depending on the sign of said measurement current, said light-emitting means terminals of said first plurality of light-emitting means and said first controlling means output terminals being electrically connected in a first series configuration across said first current supply means, said light-emitting means terminals of said second plurality of light-emitting means and said second controlling means output terminals being electrically connected in a second series configuration across said first current supply means, said first plurality of light-emitting means being successively turned on with increasing measurement current magnitude of positive sign, said second plurality of light-emitting means being successively turned on with increasing negative measurement current magnitude, all of said first plurality emitting light when said measurement current is positive and is present in an amount corresponding to the largest magnitude of positive sign, all of said second plurality emitting light when said measurement current is negative and is present in an amount corresponding to the largest magnitude of negative sign to be measured.

* * * * *